US009218939B2

(12) United States Patent
Asahata et al.

(10) Patent No.: US 9,218,939 B2
(45) Date of Patent: Dec. 22, 2015

(54) FOCUSED ION BEAM SYSTEM, SAMPLE PROCESSING METHOD USING THE SAME, AND SAMPLE PROCESSING PROGRAM USING FOCUSED ION BEAM

(71) Applicant: HITACHI HIGH-TECH SCIENCE CORPORATION, Minato-ku, Tokyo (JP)

(72) Inventors: Tatsuya Asahata, Tokyo (JP); Shota Torikawa, Tokyo (JP)

(73) Assignee: HITACHI HIGH-TECH SCIENCE CORPORATION (JP)

( * ) Notice: Subject to any disclaimer, the term of this patent is extended or adjusted under 35 U.S.C. 154(b) by 0 days.

(21) Appl. No.: 14/221,548

(22) Filed: Mar. 21, 2014

(65) Prior Publication Data
US 2014/0284307 A1 Sep. 25, 2014

(30) Foreign Application Priority Data
Mar. 25, 2013 (JP) .................................. 2013-061671

(51) Int. Cl.
H01J 37/00 (2006.01)
H01J 37/305 (2006.01)
H01J 37/30 (2006.01)

(52) U.S. Cl.
CPC ......... *H01J 37/3056* (2013.01); *H01J 37/3005* (2013.01); *H01J 2237/30466* (2013.01); *H01J 2237/31749* (2013.01)

(58) Field of Classification Search
CPC ............. H01J 2237/31745; H01J 2237/30466; H01J 37/304; H01J 2237/31749; H01J 37/3005; H01J 37/3056
USPC ........................................... 250/492.1–492.3
See application file for complete search history.

(56) References Cited

U.S. PATENT DOCUMENTS

| 5,656,811 | A  | * | 8/1997  | Itoh et al. ........................ 850/43 |
| 6,395,347 | B1 | * | 5/2002  | Adachi et al. ................. 427/526 |
| 7,375,327 | B2 | * | 5/2008  | Yoshiki et al. ................ 250/310 |
| 2008/0156770 | A1 | * | 7/2008  | Munekane ...................... 216/66 |
| 2008/0315130 | A1 | * | 12/2008 | Watanabe ................ 250/492.21 |

FOREIGN PATENT DOCUMENTS

JP  2003194681  7/2003

* cited by examiner

*Primary Examiner* — Michael Maskell
(74) *Attorney, Agent, or Firm* — Adams & Wilks

(57) ABSTRACT

A focused ion beam system includes a focused ion beam irradiation mechanism which irradiates a sample, on which a protective film is formed, with a focused ion beam from above the sample, a processing control unit which performs a removal process on both sides of a region to be a thin piece portion of the sample by the focused ion beam and sequentially forms observation surfaces parallel to an irradiation direction of the focused ion beam so as to achieve the thin piece portion, and an observation surface image generation unit which generates an observation surface image. The processing control unit terminates the removal process when a height of the protective film in the irradiation direction of the focused ion beam becomes a predetermined threshold value or less in the observation surface image.

20 Claims, 5 Drawing Sheets

FOCUSED ION BEAM SYSTEM, SAMPLE PROCESSING METHOD USING THE SAME, AND SAMPLE PROCESSING PROGRAM USING FOCUSED ION BEAM

CROSS-REFERENCE TO RELATED APPLICATION

This application claims priority from Japanese Patent Application No. 2013-061671, filed on Mar. 25, 2013, the entire subject matter of which is incorporated herein by reference.

TECHNICAL FIELD

The present invention relates to a focused ion beam system, a sample processing method using the same, and a sample processing computer program using a focused ion beam, for processing a sample having a thin piece portion used in a Transmission Electron Microscope (TEM) observation or the like.

BACKGROUND

It has been known to form a thin piece portion for a TEM observation or the like, by performing an etching process on a sample with a focused ion beam (FIB) system (for example, see JP-A-2003-194681). The thin piece portion is formed by removing both sides of a region to be a thin piece portion by irradiating a sample with an FIB from above the sample and by sequentially forming observation surfaces parallel to the irradiation direction of the FIB.

In an etching process called a lift-out method, after a rough process which forms an outline by removing both sides of a region to be a thin piece portion by irradiating a sample with an FIB while increasing a beam current, a cut is formed by inclining a sample surface and irradiating a bottom surface of the thin piece portion with the FIB. Next, a finishing process is performed on an observation surface by returning the sample surface to an original state, and irradiating the sample from above the sample with the FIB while reducing a beam current, and is terminated at a state where the interval between the observation surfaces reaches a predetermined value so as to achieve the thin piece portion having a predetermined thickness. Finally, a cut is formed by irradiating both sides of the thin piece portion with the FIB, and the thin piece portion is separated from the sample so as to be used appropriately in a TEM observation or the like.

When the sample is processed with the FIB, since there is an intensity distribution in a lateral cross-sectional direction (a direction perpendicular to the irradiation direction) in the FIB, even if the sample is irradiated with the FIB perpendicular to the sample surface, the corner portion of the sample is etched and thus an accurate cross-sectional shape cannot be obtained. Thus, a protective film made from a metal film or a carbon film is formed on the surface of the sample to prevent etching in the lateral direction by the FIB.

In recent years, as an object to be observed by a TEM becomes smaller, the thickness of a thin piece portion becomes thinner, for example, the thickness is required to be several tens of nm or less (for example 50 nm or less). Further, since work saving and sample preparing operations which do not require skill are demanded, it is necessary to automatically prepare a TEM sample in an FIB system.

However, the thinner the thickness of the thin piece portion becomes, the longer the time for the finishing process is required, so that a time of a protective film being exposed to the FIB becomes longer. Therefore, the protective film may be cut and entirely removed during the process. If the protective film is entirely removed, the processing speed of the sample (removal speed of the sample) rapidly increases and the thin piece portion is excessively cut, so that it is difficult to control the thin piece portion so as to have a target thickness, or a cross-sectional shape becomes inaccurate due to the intensity distribution in the lateral cross-sectional direction of the beam as described above.

Incidentally, the thickness of the thin piece portion is directly measured from an intensity change (decrease rate of contrast) of a back-scattered electron signal by irradiating, with electron beams, the thin piece portion being processed. However, in this case, a relationship between a film thickness and a contrast is required to be obtained in advance for each type of sample, and thus it takes time for pre-preparation. Further, since the contrast varies depending on the state of the observation surface, the irradiation condition of the electronic beam, the thickness of the thin piece portion, or the like, it is difficult to measure the thickness of the thin piece portion with high accuracy.

Thus, as the thickness of the thin piece portion becomes thinner, it is difficult to identify an end point of the removal process.

SUMMARY

The present invention has been made in view of the above-described circumstances, and an object of the present invention is to provide a focused ion beam system, a sample processing method using the same, and a sample processing computer program using a focused ion beam, which are capable of automatically controlling a thickness of a thin piece portion with high accuracy when processing a sample having the thin piece portion.

According to an illustrative embodiment of the present invention, there is provided a focused ion beam system comprising: a focused ion beam irradiation mechanism which is configured to irradiate a sample, on which a protective film is formed, with a focused ion beam from above the sample; a processing control unit which is configured to perform a removal process on both sides of a region to be a thin piece portion of the sample by the focused ion beam and sequentially form observation surfaces parallel to an irradiation direction of the focused ion beam so as to achieve the thin piece portion; and an observation surface image generation unit which is configured to generate an observation surface image, wherein the processing control unit is configured to terminate the removal process when a height of the protective film in the irradiation direction of the focused ion beam becomes a predetermined threshold value or less in the observation surface image.

According to the above configuration, since the removal process is terminated before the protective film is cut and removed by the focused ion beam (or when the protective film is removed), it is possible to control the thin piece portion so as to have a target thickness with high accuracy while the thin piece portion is not excessively cut.

Further, since the thickness of the thin piece portion is simply estimated from the height of the protective film of the observation surface image, the measurement time of the thickness is significantly reduced compared to a case where the thickness of the thin piece portion is directly measured by the intensity change or the like of a back-scattered electron signal.

According to another illustrative embodiment of the present invention, there is provided a focused ion beam system comprising: a focused ion beam irradiation mechanism which is configured to irradiate a sample with a focused ion beam from above the sample, wherein a first protective film is formed on a surface of the sample, and a second protective film is formed on the first protective film; a processing control unit which is configured to perform a removal process on both sides of a region to be a thin piece portion of the sample by the focused ion beam and sequentially form observation surfaces parallel to an irradiation direction of the focused ion beam so as to achieve the thin piece portion; and an observation surface image generation unit which is configured to generate an observation surface image, wherein the processing control unit is configured to terminate the removal process when the second protective film is removed in the observation surface image.

According to the above configuration, since the time when the second protective film is removed is regarded as the end point of the removal process, it is easy to detect the end point. Furthermore, since the first protective film is present as a layer underneath the second protective film, even if the time when the second protective film is removed t is regarded as the end point of the removal process, the thin piece portion is protected by the first protective film, and thus it is possible to reliably protect the thin piece portion from being cut excessively.

Further, since the thickness of the thin piece portion is simply estimated from the height of the protective film of the observation surface image, a measurement time of the thickness or a processing time of a computer is significantly reduced compared to a case where the thickness of the thin piece portion is directly measured by the intensity change or the like of the back-scattered electron signal.

In the above focused ion beam system, the processing control unit may be configured to determine a contrast of the protective film in the observation surface image.

Further, in the focused ion beam system, the protective film may include carbon.

According to a further illustrative embodiment of the present invention, there is provided a sample processing method using a focused ion beam system, the method comprising: irradiating a sample, on which a protective film is formed, with a focused ion beam from above the sample, performing a removal process on both sides of a region to be a thin piece portion of the sample by the focused ion beam and sequentially forming observation surfaces parallel to an irradiation direction of the focused ion beam so as to achieve the thin piece portion; and generating an observation surface image, wherein the removal process is terminated when a height of the protective film in the irradiation direction of the focused ion beam becomes a predetermined threshold value or less in the observation surface image.

According to a further illustrative embodiment of the present invention, there is provided a non-transitory computer-readable medium having a computer program stored thereon and readable by a computer for controlling a focused ion beam system, the computer program, when executed by the computer, causing the computer to perform operations comprising: irradiating a sample, on which a protective film is formed, with a focused ion beam from above the sample, performing a removal process on both sides of a region to be a thin piece portion of the sample by the focused ion beam and sequentially forming observation surfaces parallel to an irradiation direction of the focused ion beam so as to achieve the thin piece portion; and generating an observation surface image, wherein the removal process is terminated when a height of the protective film in the irradiation direction of the focused ion beam in the observation surface image becomes a predetermined threshold value or less.

According to the above configuration, when a sample having a thin piece portion is processed using a focused ion beam system, it is possible to control the thickness of the thin piece portion with high accuracy.

BRIEF DESCRIPTION OF THE DRAWINGS

The above and other aspects of the present invention will become more apparent and more readily appreciated from the following description of illustrative embodiments of the present invention taken in conjunction with the attached drawings, in which.

DETAILED DESCRIPTION

Hereinafter, illustrative embodiments of the present invention will be described with reference to drawings.

Figure 1:
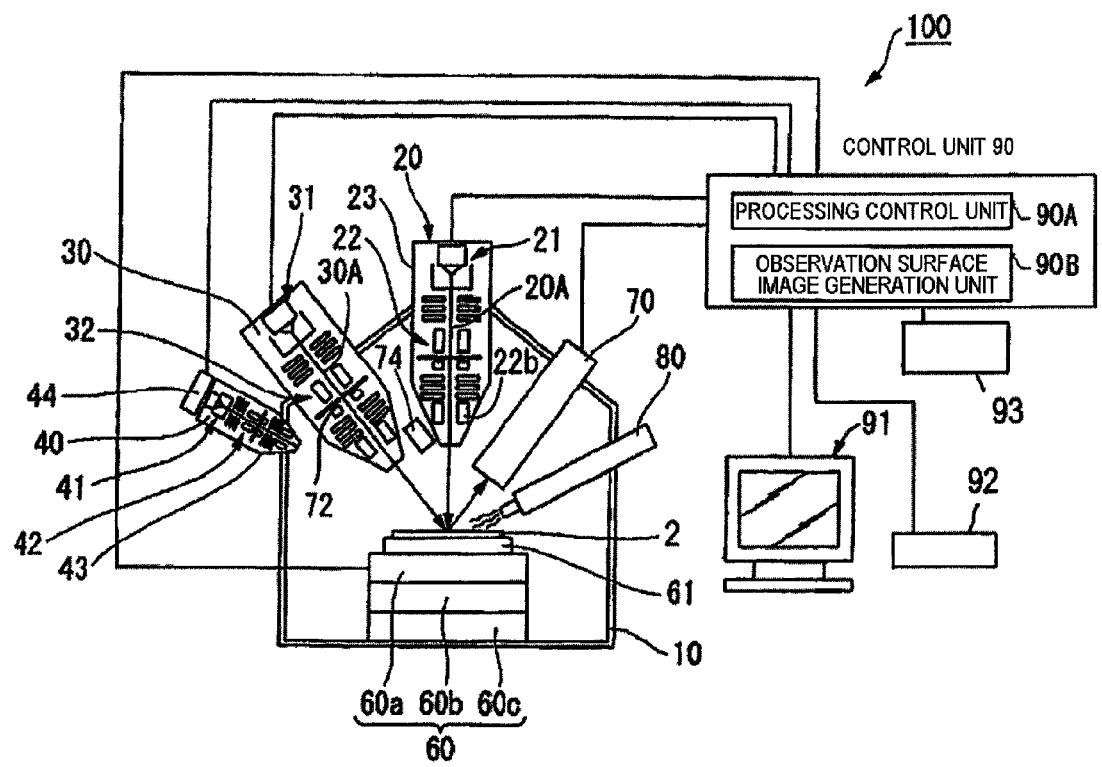
FIG. 1 is a block diagram showing an overall configuration of a focused ion beam system according to an illustrative embodiment of the present invention.

FIG. 1 is a block diagram showing an overall configuration of a focused ion beam system 100 according to an illustrative embodiment of the present invention. In FIG. 1, the focused ion beam system 100 includes a vacuum chamber 10, an ion beam irradiation system (an example of a focused ion beam irradiation mechanism) 20, an electronic beam irradiation system (an example of electronic beam irradiator) 30, an argon ion beam irradiation system 40, a sample stage 60, a secondary charged particle detector 70, a reflected electron detector 72, a gas gun 80, and a control unit 90. The pressure of the inside of the vacuum chamber 10 is decreased to a predetermined degree of vacuum, and all or some of components of the focused ion beam system 100 are disposed inside the vacuum chamber 10.

The sample stage 60 supports a sample platform 61 movably, and a sample 2 is placed on the sample platform 61. The sample stage 60 includes a moving mechanism capable of displacing the sample platform 61 along five axes. The moving mechanism includes an XYZ-moving mechanism 60b which moves the sample platform 61 respectively along an X-axis and a Y-axis which are parallel to a horizontal plane and are orthogonal to each other and a Z axis which is orthogonal to the X-axis and the Y-axis, a rotation mechanism 60c which rotates the sample platform 61 around the Z-axis, and a tilting mechanism 60a which rotates the sample platform 61 around the X-axis (or the Y-axis). The sample stage 60 displaces the sample platform 61 along the five axes, and thus moves the sample 2 to an irradiation position of an ion beam 20A.

The control unit 90 is implemented by a computer including a central processing unit (CPU), a storage unit (RAM and ROM) 93 which stores data, a program and the like, and an input port and an output port which input and output signals with respect to external devices. The control unit 90 controls respective components of the focused ion beam system 100 by the CPU performing various operation processes based on the program stored in the storage unit 93. The control unit 90 is electrically connected to the ion beam (hereinafter, focused ion beam is suitably abbreviated as an "ion beam") irradiation system 20, the electronic beam irradiation system 30, the argon ion beam irradiation system 40, a nano tweezers 50, the secondary charged particle detector 70, the reflected electron detector 72, a control wiring of the sample stage 60, and the like.

The control unit 90 includes a processing control unit 90A and an observation surface image generation unit 90B.

The control unit 90 drives the sample stage 60 based on an instruction of software or an input by an operator, and can adjust the irradiation position and the irradiation angle of the ion beam 20A to the sample 2 surface by adjusting a position or a posture of the sample 2.

In addition, an input unit 92 such as a keyboard which obtains an input instruction from an operator is connected to the control unit 90.

The processing control unit 90A controls the sample stage 60, an ion source 21 and an ion beam irradiation system optical system 12 so as to control the irradiation of the ion beam 20A. Specifically, the processing control unit 90A controls the output of the ion beam 20A emitted from the ion source 21 and controls a deflector 22b so as to control an irradiation condition of the ion beam 20A. Further, the processing control unit 90A performs a removal process on a predetermined portion of the sample by irradiating the sample with the ion beam 20A while moving the ion beam 20A by the deflector 22b so as to form the thin piece portion.

Figure 2:
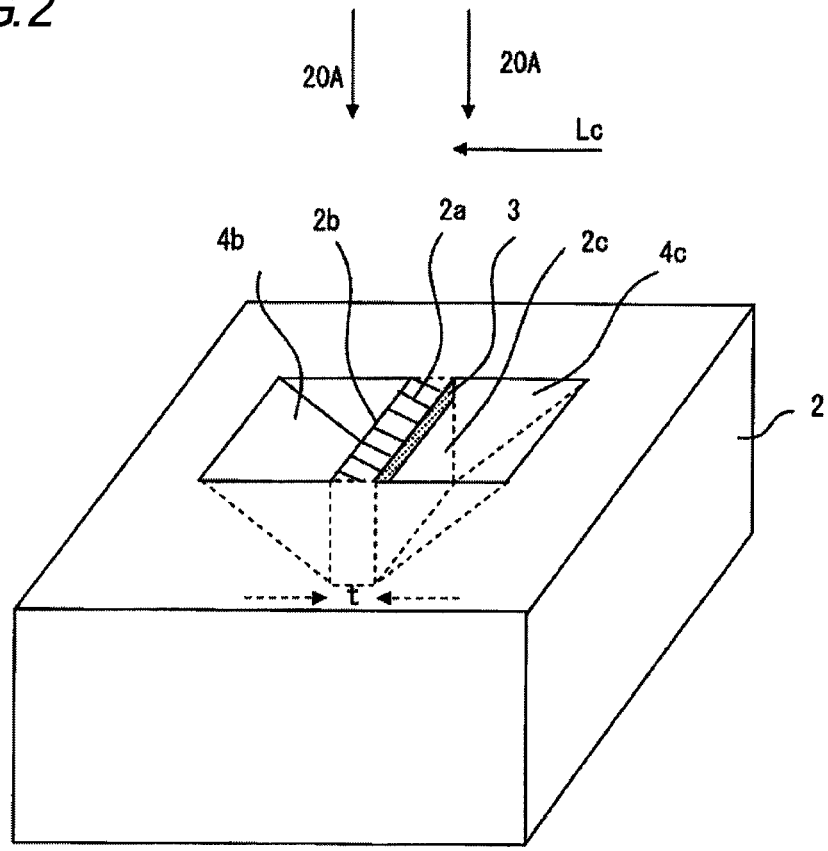
FIG. 2 is a diagram showing a method of performing a removal process of a sample.

The removal process is performed, for example, as shown in FIG. 2. First, a protective film 3 is formed on a surface of the sample 2. The protective film 3 may be formed only on an upper surface (a hatched portion in FIG. 2) of a region to be a thin piece portion 2a, or may be formed on an entire surface of the sample 2. Then, both sides of the region to be a thin piece portion 2a in the sample 2 are removed in a trench shape (groove shape) in a depth direction by irradiating the surface of the sample 2 (protective film 3) with the ion beam 20A in a direction perpendicular thereto so as to form inclined surfaces 4b and 4c which are inclined from the surface, thereby forming an outline of the thin piece portion 2a (rough process). Next, the surface of the sample is inclined and a cut is formed by irradiating a bottom surface of the thin piece portion 2a with the ion beam 20A. Next, after the surface of the sample 2 is returned to an original state, a finishing process is performed in which observation surfaces 2b and 2c which are parallel to the irradiation direction of the ion beam 20A are sequentially formed by irradiating the sample with the ion beam 20A while reducing a beam current from above the sample, and is terminated at a state where the interval between the observation surfaces 2b and 2c reaches a predetermined value t so as to achieve the thin piece portion 2a having a thickness t. Finally, a cut is formed by irradiating both sides of the thin piece portion 2a with the ion beam 20A from above the sample, and the thin piece portion 2a is separated from the sample and provided for a TEM observation or the like appropriately.

In addition, in the finishing process, for example, after the observation surface 2b on the left side is first formed, an observation surface 2c is sequentially formed so as to be close to the observation surface 2b side by sequentially line-scanning and moving the ion beam 20A in parallel to the observation surface 2b and in an Lc direction from the right to the left in FIG. 2 relatively to the sample 2, and a position at which the interval between the observation surfaces 2b and 2c reaches a predetermined value t is set to an end point of the process.

The observation surface image generation unit 90B generates images of respective observation surfaces 2c which are sequentially formed. Here, in the present illustrative embodiment, reflected electrons which are generated by irradiating the observation surface 2c with an electronic beam 30A from the electronic beam irradiation mechanism 30 are detected in the reflected electron detector 72. Then, the observation surface image generation unit 90B generates a reflected electron image (observation surface image) of the observation surface 2c based on the data detected by the reflected electron detector 72.

Here, in the reflected electron image, the larger the atomic number is, the more the reflected electrons are released, and the larger the product (atomic number×density) is (i.e. the heavier the elements), the brighter the contrast is. Accordingly, it is possible to distinguish between the sample 2 and the protective film 3 from the difference in the contrast in the observation surface image. Further, the contrast of a reflected electro image is obtained through digitizing by dividing the brightness of the image in a stepwise manner. Since the reflected electron image is a black and white image, for example, a gray scale value can be defined by a gray scale value in which white is set to 256 and a gray scale value of black is set to 1, and each image corresponds to a predetermined gray scale value. Accordingly, the range of a contrast (gray scale value) corresponding to the protective film 3 is set in advance and a region (pixel) having a contrast of the above range in the observation surface image is obtained, so that the height of the protective film 3 (the thickness of the protective film 3 in the direction perpendicular to the surface of the sample 2) can be automatically measured.

Further, the contrast can be set by an operator operating the input unit 92 and designating a region of the protective film 3 on the reflected electron image of the first observation surface 2c. When the designated region includes a plurality of pixels, a determination method of the contrast of the region is not particularly limited, and the contrast may be, for example, an average value of gray scale values of the pixels, or a maximum value among gray scale values of respective pixels may be employed as the contrast. Further, if the operator selects one point (one pixel) in the region, a contrast may be set by automatically obtaining a plurality of pixels of a predetermined region in the vicinity thereof.

On the other hand, while the reflected electron image of the observation surface 2c is not observed, the contrast of the protective film 3 may be set as an initial value. For example, the contrast may be set by the gray scale value which is input by the operator operating the input unit 92. This case corresponds to a case where, for example, the type (composition) of the protective film 3 is known in advance and the contrast of the reflected electron image of the observation surface is also known. In this case, if the operator designates a type of the protective film 3 on a predetermined screen instead of inputting the gray scale value, the gray scale value corresponding to the protective film 3 may be automatically designated.

In a case where the contrasts of the sample 2 and the protective film 3 are clearly distinguished even if an SEM image is used instead of the reflected electron image, the observation surface image generation unit 90B may generate the SEM image as the observation surface image using a secondary charged particle detector 70 instead of using a reflected electron detector 72. Further, in a case where the contrasts of the sample 2 and the protective film 3 can be clearly distinguished even if the SIM image is used instead of the reflected electron image, the observation surface image generation unit 90B may generate the SIM image as an observation surface image using the secondary charged particle detector 70. When the sample 2 is irradiated with the ion beam 20A, the secondary charged particle detector 70 detects secondary electrons generated from the sample 2. However, in this case, when the SIM image is generated, it is necessary to incline the focused ion beam irradiation mechanism 20 with respect to the observation surface 2c from a position immediately above the sample 2. Further, instead of inclining the focused ion beam irradiation mechanism 20, a second focused ion beam irradiation mechanism is further provided, and the SIM image may be generated using the second focused ion beam irradiation mechanism.

The second focused ion beam irradiation mechanism is an ion beam irradiation mechanism including a gas electric field ionization ion source, for example, if ion types such as hydrogen, helium, oxygen, nitrogen, argon, and xenon are used, it is possible to irradiate an ion beam having a small beam diameter, thereby obtaining an observation image with high resolution.

The observation surface image is output to a display device (an example of a display unit) 91 connected to the control unit 90 and is stored in a storage unit 93 as image data (bitmap data).

The ion beam irradiation system 20 includes an ion source 21 which generates ions, and an ion optical system 22 which forms ions which flow out from the ion source 21 into a focused ion beam so as to be scanned. The sample 2 on the sample stage 60 in the vacuum chamber 10 is irradiated with the ion beam 20A which is a charged particle beam, from the ion beam irradiation system 20 including an ion beam column 23. At this time, secondary charged particles such as secondary ions and secondary electrons are generated from the sample 2. The image of the sample 2 is obtained by detecting secondary charged particles in the secondary charged particle detector 70. Further, the ion beam irradiation system 20 increases the irradiation amount of the ion beam 20A, and performs an etching process (removal process) on the sample 2 in the irradiation range.

The ion optical system 22 includes, for example, a condenser lens which focuses the ion beam 20A, an iris which narrows down the ion beam 20A, an aligner which adjusts an optical axis of the ion beam 20A, an objective lens which focuses the ion beam 20A onto the sample, and a deflector 22b which scans the ion beam 20A on the sample.

The electronic beam irradiation system 30 includes an electron source 31 which emits electrons, and an electron optical system 32 which focuses electrons emitted from the electron source 31 so as to be scanned. The reflected electrons generated in the sample 2 are detected in the reflected electron detector 72 by irradiating the sample 2 with the electronic beam 30A emitted from the electronic beam irradiation system 30, so that as described above, it is possible to obtain the reflected electron image of the sample 2.

The argon ion beam irradiation system 40 includes an argon ion source 41, an argon ion optical system 42, an argon ion beam column 43, and a beam position control unit 44 for controlling the irradiation position of the argon ion beam. The argon ion beams for cleaning the sample 2 are radiated from the argon ion beam irradiation system 40. Accordingly, it can be used as an ion beam of the finishing process.

The gas gun 80 applies a predetermined gas such as an etching gas to the sample 2. Since the sample 2 is irradiated with the ion beam 20A while the etching gas is supplied from the gas gun 80, it is possible to increase an etching speed of the sample by the ion beam 20A. Further, since the sample 2 is irradiated with the ion beam 20A while a gas mixture is supplied from the gas gun 80, it is possible to perform an extraction (deposition) of gas components locally in the vicinity of an irradiation region of the ion beam 20A.

Next, referring to FIGS. 3 to 5, the detection of the end point of the removal process by the focused ion beam system 100 according to the illustrative embodiment of the present invention will be described. First, the observation surface 2c of the sample 2 is formed in the manner shown in FIG. 2.

Figure 3:
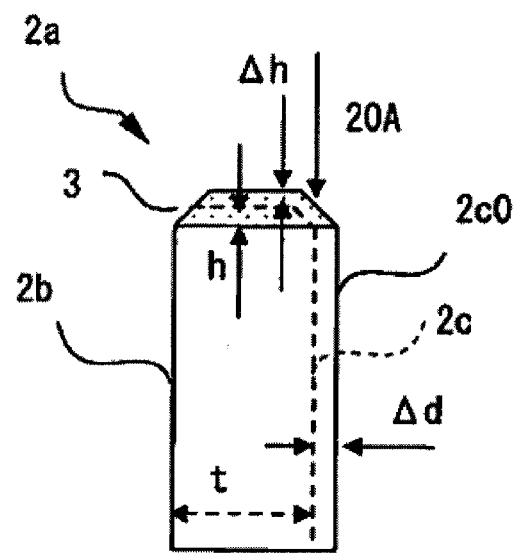
FIG. 3 is a diagram showing a cross-sectional shape of a thin piece portion during a finishing process.

FIG. 3 is a diagram showing a cross-sectional shape of the thin piece portion 2a during a finishing process. The cross-section is along a plane which is parallel to the irradiation direction of the ion beam 20A and perpendicular to the observation surface 2c. A case is considered in which a new observation surface 2c (dashed line in FIG. 3) is formed by sequentially cutting an initial observation surface 2c0 by a cutting amount $\Delta d$ in the lateral direction (right and left direction in FIG. 3) to the observation surface 2b by irradiating the ion beam 20A.

As described above, due to the intensity distribution of the cross sectional direction (right and left direction in FIG. 3) of the ion beam 20A, the protective film 3 in the upper part of the thin piece portion 2a is cut from the upper surface and the side surface, and the height of the protective film 3 is also decreased by $\Delta h$ in the height direction (vertical direction in FIG. 3 and an irradiation direction of the ion beam 20A) so as to become the height h. That is, this indicates that there is a correlation between the $\Delta(h)$ and the $\Delta d$.

Figure 4:
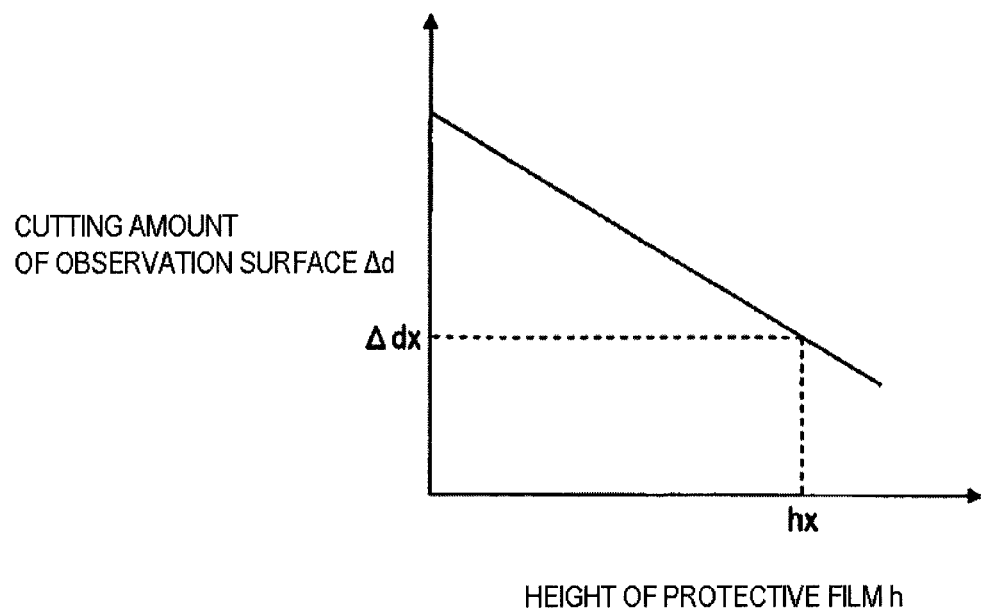
FIG. 4 is a diagram showing a correlation between a height h of a protective film and a cutting width Δd of an observation surface.
Figure 5:
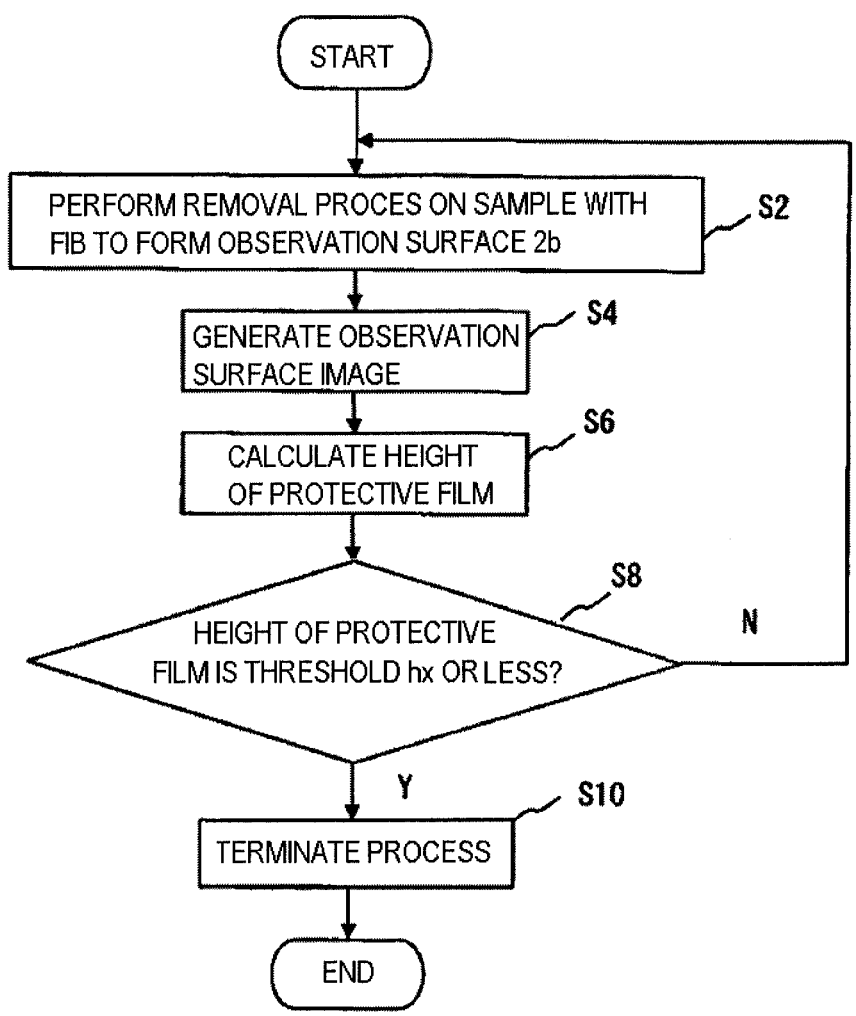
FIG. 5 is a diagram showing a control flow of a removal process of a sample.

Accordingly, as shown in FIG. 4, if the correlation between h (or $\Delta h$) and $\Delta d$ is measured in advance and the height h of the protective film 3 is obtained from the observation surface image, it is possible to estimate the cutting amount $\Delta d$ and the thickness t of the thin piece portion 2a and to detect the end point of the removal process. In other words, an initial interval t0 between the observation surface 2c0 in an initial state of the finishing process and the observation surface 2b is measured, and the height of the protective film 3 of the observation surface image is obtained while sequentially forming a new observation surface 2c so as to be close to the observation surface 2b side. Then, if the process is terminated when the height h reaches a predetermined threshold value hx, the thin piece portion 2a of a thickness t is achieved while a thickness t=t0−$\Delta$dx ($\Delta$dx is a cutting amount at the time of hx). For example, as an example of a relationship of FIG. 4, the height (h) of the protective film 3 is 0.2 μm for the thin piece portion 2a of a thickness 50 nm, and the height (h) of the protective film 3 is 0 μm for the thin piece portion 2a of a thickness 10 nm.

That is, since the removal process is terminated before the protective film is cut and entirely removed by the focused ion beam (or when it is lost), it is possible to control the thin piece portion so as to have a target thickness with high accuracy while the thin piece portion is not excessively cut.

Further, the thickness of the thin piece portion is simply estimated from the height of the protective film of the observation surface image. Compared to a case where the thickness of the thin piece portion is directly measured by the intensity change or the like of the back-scattered electron signal, in this case, the measurement time of the thickness is significantly reduced and the thickness of the thin piece portion can be automatically controlled without any operator's input.

In addition, in the above-described example, although a threshold value hx is determined based on the relationship between the height h and the $\Delta d$, a threshold value hx may be determined based on the relationship between the height h and the thickness t. In this case, a relational expression t0−t=Δd is used (t0 is an initial thickness of the thin piece portion 2a). The following examples are same in this regard.

Next, referring to FIG. 5, the flow of control of the removal process of the sample 2 will be described. First, as described above, the rough process of the sample 2 is performed, and the inclined surface 4b and the facing surface 2b are formed (see FIG. 2). Next, as the finishing process, the processing control unit 90A forms the observation surface 2c in advance.

Next, as the finishing process, the processing control unit 90A performs a removal process of the sample 2 using the ion beam 20A to form the observation surface 2c (step S2). The operation of step S2 can be performed, for example, by an operator activating software for performing a process of this device on an operation setting screen on the display device 91.

The observation surface image generation unit 90B generates the observation surface image of the observation surface 2b and registers the image in the storage unit 93 (step S4).

Next, the processing control unit 90A obtains the observation surface image of the observation surface 2c from the storage unit 93, extracts the contrast of the protective film 3 from the observation surface image and calculates the height of the protective film 3 (step S6). For example, the contrast value of the protective film 3 (may be in the range of the contrast) is registered in advance in the storage unit 93, and the processing control unit 90A extracts the pixels having the contrast value from the observation surface image, and calculates the height of the arrangement of the pixels in the irradiation direction of an ion beam so as to be the thickness of the protective film 3.

Then, the processing control unit 90A determines whether the height of the protective film 3 calculated in step S6 is the threshold value hx or less of the height of the protective film 3, which is registered in advance in the storage unit 93 (step S8). If "No" in step S8, the process returns to step S2 and forms the next observation surface 2c. Specifically, the processing control unit 90A, as described above, scans the ion beam 20A in the Lc direction from the right to left in FIG. 2 relatively to the sample 2, and forms a new observation surface 2c so as to be close to the observation surface 2b.

On the other hand, if "Yes" in step S8, the processing control unit 90A terminates the removal process by the ion beam 20A (step S10).

The threshold value hx is obtained, for example, as described above, by the operator obtaining Δdx from the relational expression of the thickness of the thin piece portion to be a target t=t0−Δdx (where, t0 is an interval between the initial observation surface 2c0 and the observation surface 2b), and obtaining the height h and the threshold value hx from the correlation between the height h and Δd of the protective film 3 shown in FIG. 4. Then, for example, the threshold value hx can be input and set by the operator operating the input unit 92. The threshold value hx is obtained by the equation hx=h0−h (h0 is the height of the initial observation surface 2c0).

Incidentally, the threshold value hx may be 0 or more. If the threshold value hx>0, the removal process is terminated before the protective film is cut and entirely removed by the FIB, so that the thin piece portion is not cut excessively. Further, if the threshold value hx=0, the removal process is terminated just when the protective film is cut and entirely removed by the FIB, so that the thin piece portion is not cut excessively. However, in order to reliably prevent the thin piece portion from being excessively cut, it is preferable that the threshold value hx>0.

Figure 6:
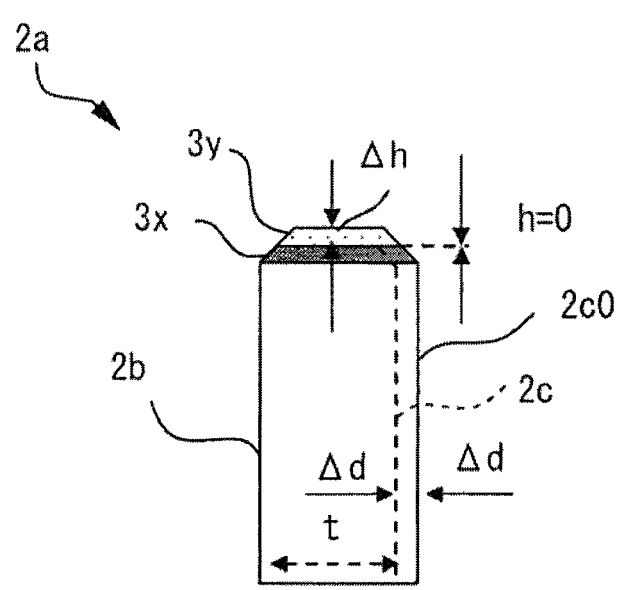
FIG. 6 is diagram showing a cross-sectional shape of the thin piece portion during the finishing process according to another illustrative embodiment of the present invention.

Next, referring to FIG. 6, the detection of the end point by the focused ion beam system 100 when a first protective film 3x and a second protective film 3y are formed in order on the surface of the sample 2 will be described. FIG. 6 is a diagram corresponding to FIG. 3, and shows a cross-sectional shape of the thin piece portion 2a during the finishing process. A case is considered in which the sample 2 is sequentially cut by the cutting amount Δd by irradiation of the ion beam 20A, in the lateral direction (right and left direction in FIG. 6) from the initial observation surface 2c0 to the observation surface 2b side to form a new observation surface 2c (dashed line in FIG. 6).

As described above, due to the intensity distribution of the ion beam 20A in the lateral cross sectional direction (right and left direction in FIG. 6), the second protective film 3y in the upper part of the thin piece portion 2a is cut from the upper side and the side surface and the first protective film 3x is cut from the side surface. Therefore, the height of the second protective film 3y is reduced by Δh in the height direction (vertical direction in FIG. 6 and the irradiation direction of the ion beam 20A). At this time, the relationship between Δh(h) and Δd is the same as the case in FIG. 3. Accordingly, as shown in FIG. 4, a correlation between h (or Δh) and Δd is measured in advance, and the height h of the second protective film 3y is measured from the observation surface image, so that the cutting amount Δd, and the thickness of the thin piece portion 2a can be measured, and the end point of the removal process can be measured.

Then, since the time at which the second protective film 3y is entirely removed (height h=0) is set as, for example, the end point of the removal process and the contrast of the second protective film 3y becomes 0 at the end point, it is easy to detect the end point. Further, since the first protective film 3x is present as a layer underneath the second protective film 3y, while the time when the second protective film 3y is entirely removed is set as the end point of the removal process, the first protective film 3x protects the thin piece portion 2a and thus it is possible to reliably prevent the thin piece portion from being excessively cut.

Incidentally, for example, the sample 2, which is not particularly limited thereto but, for example, may be a semiconductor such as silicon, a metal or an alloy.

In the meantime, it is preferable that the protective film includes carbon since the contrast difference between the protective film 3 and the sample 2 which is mainly made from, for example, silicon is increased on the reflected electron image, the SIM image or the SEM image. If the contrast is large, the height of the protective film can be detected clearly in the observation image. A raw material of the protective film including carbon may be phenanthrene or naphthalene. Further, the protective films can be formed using, for example, a focused ion beam chemical vapor deposition (FIB-CVD) method and an electronic beam chemical vapor deposition (EB-CVD) method. According to the method, it is possible to form a protective film only in a necessary portion of the sample 2 surface without using a mask. The EB-CVD is preferable since there is no damage in a sample in a deposition process. In addition, the FIB-CVD is preferable since the FIB-CVD is faster than the EB-CVD in the deposition speed.

Further, a combination example in a case of using the first protective film 3x and the second protective film 3y as the protective film includes a case where a layer of a mixture of carbon and tungsten is used as the first protective film 3x and a carbon layer having organic compounds as a raw material is used as the second protective film 3y. Another combination includes a case where a layer of carbon is used as the first protective film 3x with the EB-CVD method, and carbon is used as the second protective film 3y with the FIB-CVD method. These combinations are preferable since the contrast difference between the first protective film 3x and the second protective film 3y is large on the reflected electron image and the SIM image, and the boundary between the first protective film 3x and the second protective film 3y can be clearly measured. Further, if a film is deposited by the FIB-CVD on a film formed by the EB-CVD having no damage to the sample, the film formed by the EB-CVD mitigates the damage to the sample at the time of deposition by the FIB-CVD and the deposition speed of the FIB-CVD is fast, so that it is possible to form the protective film with good efficiency. In addition, even by changing the acceleration voltage and the amount of a current of a beam used in the deposition, it is possible to increase the contrast of the protective film in the observation image.

While the present invention has been shown and described with reference to certain illustrative embodiments thereof, it will be understood by those skilled in the art that various changes in form and details may be made therein without departing from the spirit and scope of the invention as defined by the appended claims.

What is claimed is:

1. A focused ion beam system comprising:
    a focused ion beam irradiation mechanism configured to irradiate a sample, on which a protective film is formed, with a focused ion beam from above the sample;
    a processing control unit configured to perform a removal process on both sides of a region to be a thin piece portion of the sample by the focused ion beam and sequentially form observation surfaces parallel to an irradiation direction of the focused ion beam so as to process the thin piece portion to a target thickness; and
    an observation surface image generation unit configured to generate an observation surface image of at least one of the observation surfaces,
    wherein the processing control unit is configured to terminate the removal process when a height of the protective film becomes a predetermined threshold value in the observation surface image.

2. The focused ion beam system according to claim 1, wherein the processing control unit is configured to determine a contrast of the protective film in the observation surface image.

3. The focused ion beam system according to claim 1, wherein the protective film includes carbon.

4. A focused ion beam system comprising:
    a focused ion beam irradiation mechanism configured to irradiate a sample with a focused ion beam from above the sample, wherein a first protective film is formed on a surface of the sample, and a second protective film is formed on the first protective film;
    a processing control unit configured to perform a removal process on both sides of a region to be a thin piece portion of the sample by the focused ion beam and sequentially form observation surfaces parallel to an irradiation direction of the focused ion beam so as to process the thin piece portion to a target thickness; and
    an observation surface image generation unit configured to generate an observation surface image of at least one of the observation surfaces,
    wherein the processing control unit is configured to terminate the removal process when the second protective film is removed in the observation surface image during the removal process.

5. The focused ion beam system according to claim 4, wherein the processing control unit is configured to determine a contrast of the second protective film in the observation surface image.

6. The focused ion beam system according to claim 4, wherein the second protective film includes carbon.

7. A sample processing method using a focused ion beam system, the method comprising:
    irradiating a sample, on which a protective film is formed, with a focused ion beam from above the sample,
    performing a removal process on both sides of a region to be a thin piece portion of the sample by the focused ion beam and sequentially forming observation surfaces parallel to an irradiation direction of the focused ion beam so as to process the thin piece portion to a target thickness;
    generating an observation surface image of at least one of the observation surfaces; and
    terminating the removal process when a height of the protective film becomes a predetermined threshold value in the observation surface image.

8. A non-transitory computer-readable medium having a computer program stored thereon and readable by a computer for controlling a focused ion beam system, the computer program, when executed by the computer, causing the computer to perform operations comprising:
    irradiating a sample, on which a protective film is formed, with a focused ion beam from above the sample,
    performing a removal process on both sides of a region to be a thin piece portion of the sample by the focused ion beam and sequentially forming observation surfaces parallel to an irradiation direction of the focused ion beam so as to process the thin piece portion to a target thickness;
    generating an observation surface image of at least one of the observation surfaces; and
    terminating the removal process when a height of the protective film in the observation surface image becomes a predetermined threshold value.

9. The focused ion beam system according to claim 1, further comprising a charged particle beam irradiation mechanism configured to irradiate the sample with a charged particle beam, different from the focused ion beam used to perform the removal process, to cause the sample to generate secondary charged particles that are used to generate the observation surface image.

10. The focused ion beam system according to claim 9, wherein the irradiation direction of the charged particle beam is different from the irradiation direction of the focused ion beam.

11. The focused ion beam system according to claim 9, wherein the charged particle beam irradiation mechanism comprises an electron beam irradiation mechanism that irradiates the sample with an electron beam.

12. The focused ion beam system according to claim 9, wherein the charged particle beam irradiation mechanism comprises an ion beam irradiation mechanism having a gas electric field ionization ion source that irradiates the sample with an ion beam.

13. The focused ion beam system according to claim 4, further comprising a charged particle beam irradiation mechanism configured to irradiate the sample with a charged particle beam, different from the focused ion beam used to perform the removal process, to cause the sample to generate secondary charged particles that are used to generate the observation surface image.

14. The focused ion beam system according to claim 13, wherein the irradiation direction of the charged particle beam is different from the irradiation direction of the focused ion beam.

15. The focused ion beam system according to claim 13, wherein the charged particle beam irradiation mechanism comprises an electron beam irradiation mechanism that irradiates the sample with an electron beam.

16. The focused ion beam system according to claim 13, wherein the charged particle beam irradiation mechanism comprises an ion beam irradiation mechanism having a gas electric field ionization ion source that irradiates the sample with an ion beam.

17. The sample processing method according to claim 7, wherein the observation surface image is generated by irradiating the observation surface with a charged particle beam different from the focused ion beam used for the removal process.

18. The sample processing method according to claim 17, wherein the irradiation direction of the charged particle beam is different from the irradiation direction of the focused ion beam.

19. The non-transitory computer-readable medium according to claim 8, wherein the observation surface image is generated by irradiating the observation surface with a charged particle beam different from the focused ion beam used for the removal process.

20. The non-transitory computer-readable medium according to claim 19, wherein the irradiation direction of the charged particle beam is different from the irradiation direction of the focused ion beam.

\* \* \* \* \*